(12) United States Patent
El Gabaly Marquez et al.

(10) Patent No.: US 9,947,379 B1
(45) Date of Patent: Apr. 17, 2018

(54) DEVICE AND METHODS FOR WRITING AND ERASING ANALOG INFORMATION IN SMALL MEMORY UNITS VIA VOLTAGE PULSES

(71) Applicant: National Technology & Engineering Solutions of Sandia, LLC, Alburquerque, NM (US)

(72) Inventors: Farid El Gabaly Marquez, Berkeley, CA (US); Albert Alec Talin, Dublin, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 15/287,552

(22) Filed: Oct. 6, 2016

(51) Int. Cl.
*G11C 7/22* (2006.01)
*G11C 5/14* (2006.01)
*H01L 23/498* (2006.01)
*H01L 27/112* (2006.01)

(52) U.S. Cl.
CPC .......... *G11C 7/22* (2013.01); *G11C 5/14* (2013.01); *H01L 23/498* (2013.01); *H01L 23/49866* (2013.01); *H01L 27/112* (2013.01)

(58) Field of Classification Search
CPC G11C 7/22; G11C 5/14; H01L 23/498; H01L 23/49866; H01L 27/112
See application file for complete search history.

(56) References Cited

U.S. PATENT DOCUMENTS

| 5,339,275 | A | 8/1994 | Hyatt |
| 5,430,670 | A | 7/1995 | Rosenthal |
| 6,185,119 | B1 | 2/2001 | Haeberli et al. |
| 6,653,193 | B2 | 11/2003 | Gilton |
| 6,992,323 | B2 | 1/2006 | Krieger et al. |
| 2016/0071565 | A1* | 3/2016 | Lemke ............. H01L 27/10805 365/226 |

* cited by examiner

*Primary Examiner* — Tri Hoang
(74) *Attorney, Agent, or Firm* — Medley, Behrens & Lewis, LLC

(57) ABSTRACT

Devices and methods for non-volatile analog data storage are described herein. In an exemplary embodiment, an analog memory device comprises a potential-carrier source layer, a barrier layer deposited on the source layer, and at least two storage layers deposited on the barrier layer. The memory device can be prepared to write and read data via application of a biasing voltage between the source layer and the storage layers, wherein the biasing voltage causes potential-carriers to migrate into the storage layers. After initialization, data can be written to the memory device by application of a voltage pulse between two storage layers that causes potential-carriers to migrate from one storage layer to another. A difference in concentration of potential carriers caused by migration of potential-carriers between the storage layers results in a voltage that can be measured in order to read the written data.

18 Claims, 5 Drawing Sheets

DEVICE AND METHODS FOR WRITING AND ERASING ANALOG INFORMATION IN SMALL MEMORY UNITS VIA VOLTAGE PULSES

STATEMENT OF GOVERNMENTAL INTEREST

This invention was developed under Contract DE-AC04-94AL85000 between Sandia Corporation and the U.S. Department of Energy. The U.S. Government has certain rights in this invention.

BACKGROUND

In conventional semiconductor memory devices, data is stored digitally as a series of bit values. Data values other than binary 0 and 1, for example integers, are stored as a plurality of bit values interpretable together as representing a single data value. Thus, in order to increase a range of data values able to be represented by a conventional memory device, a number of bit values capable of being simultaneously stored by the conventional memory device must be increased. Practically, therefore, the physical size and power consumption of conventional memory devices must be increased in order to increase the range of data values capable of being stored by the conventional devices.

SUMMARY

The following is a brief summary of subject matter that is described in greater detail herein. This summary is not intended to be limiting as to the scope of the claims.

Described herein are various technologies pertaining to non-volatile, analog memory devices. In an exemplary embodiment, first and second memory components comprising respective first and second potential-carrier storage layers are deposited on a barrier layer, which is itself deposited on a potential-carrier source layer. In its unbiased state, the barrier layer prevents migration of potential-carriers from the potential-carrier source layer to the storage layers, or from one storage layer to another. In order to initialize the memory components, a biasing voltage can be applied between the source layer and the storage layers, whereupon potential-carriers migrate from the source layer to the storage layers. After initialization, analog data can be written to and read from the storage layers based upon movement of potential-carriers from one of the storage layers to another. To write data, a voltage pulse is applied between the first storage layer and the second storage layer. The voltage pulse causes potential-carriers to move from one storage layer to the other. Since the potential-carriers move only from one storage layer to another by way of the barrier layer, the migration of potential-carriers causes a difference in concentration of potential-carriers. The difference in potential-carrier concentration gives rise to an electrical potential (voltage) between the first and second storage layers. Data is read from the storage layers by measuring the voltage caused by the migration of the potential-carriers. Due to the presence of the barrier layer, potential-carriers generally migrate only in response to applied voltage pulses, and so data can be maintained in storage without requiring continuous power consumption.

A range and resolution of data values that can be written to and read from the analog memory device depends upon a resolution of an amplitude and duration of a voltage pulse, as well as a resolution of voltage measurements between the first and second storage layers. A data resolution of the analog memory device can therefore be improved by improving control of the input voltage pulse or improving measurement resolution of a device or component used to measure the voltage between the storage layers.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
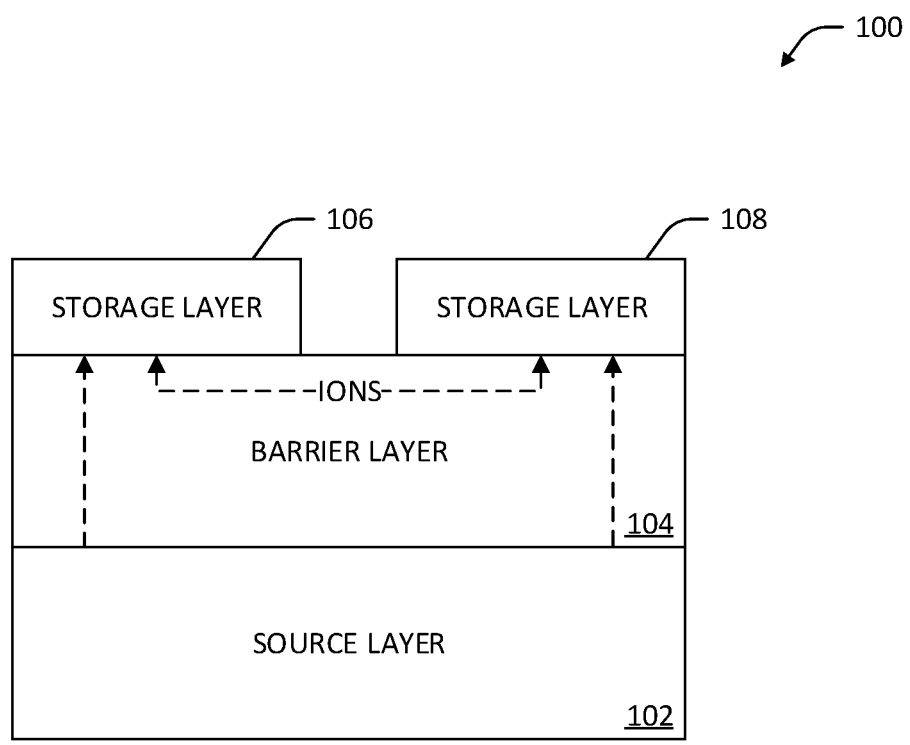
FIG. 1 is a diagram of an exemplary non-volatile analog memory device.

Various technologies pertaining to analog memory are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

With reference to FIG. 1, an exemplary memory device 100 is illustrated. The memory device 100 can be used to read and write analog information to non-volatile storage. The device 100 includes a potential-carrier source layer 102, a barrier layer 104 deposited on the source layer 102, and potential-carrier storage layers 106 and 108 deposited on the barrier layer 104. In an initialization phase, the device 100 can be prepared for reading and writing of data by applying a biasing voltage between the source layer 102 and the storage layers 106-108. In an operational state, data can be written to the device 100 by applying voltages between the storage layers 106 and 108. Data can be read from the device 100 by performing a high-impedance measurement of a voltage between the storage layers 106 and 108.

Details of operation of the device 100 are now described. The source layer 102 comprises a material that has potential-carrier atoms that can be converted to ions in response to application of a biasing voltage. The storage layers 106-108 comprise a material capable of receiving potential-carriers from the source layer 102. The storage layers 106-108, which in some certain embodiments do not have potential-carrier atoms after initial fabrication of the device 100, can be provided with potential-carrier atoms by applying a biasing voltage between the source layer 102 and each of the storage layers 106-108. The biasing voltage causes a flow of electrons that converts the potential-carrier atoms to ions and causes the ions to migrate to the storage layers 106-108 where such potential-carriers convert back from ions to atoms. Subsequent to removal of the biasing voltage, the potential-carriers in the storage layers 106-108 are prevented from migrating out of the storage layers 106-108 by the barrier layer 104. The chemical structure of the barrier layer 104 prevents potential-carrier atoms from passing through from the storage layers 106-108 while allowing potential-carrier ions to pass. The presence of potential-carrier atoms in varying concentrations in different places gives rise to electric potential differences (i.e., voltages) between regions or materials having different concentrations of the potential-carriers. An initial zero-potential state between storage layer 106 and storage layer 108 can be set by electrically shorting the storage layers 106-108, causing a level of potential-carriers in the layers 106-108 to equalize.

Once the storage layers 106-108 are initialized with potential carriers, data can be written to and read from the device 100. Data is written to the memory device 100 by application of a voltage pulse between storage layer 106 and storage layer 108. Similarly to the biasing voltage used to initialize the storage layers 106-108, the voltage pulse between layers 106 and 108 causes potential-carrier atoms to become ions and move through the barrier layer 104 from one of the storage layers 106-108 to the other. Since the storage layers 106 and 108 are not in physical contact, a migration path of the potential carriers between the storage layer 106 and the storage layer 108 runs through the barrier layer 104. The migration of potential-carriers between the storage layers 106-108 causes a difference in concentration of potential-carriers between the storage layer 106 and the storage layer 108. The difference in concentration of potential-carriers gives rise to an electric potential (voltage) between the layer 106 and the layer 108. A number of potential-carriers migrating between the storage layers 106 and 108, and by extension the voltage between the layers 106-108, depends on a duration and a voltage level of the voltage pulse applied to the layers 106-108 when writing data. Thus, a data value written to the memory device 100 can be controlled by selecting an appropriate duration and voltage level of the voltage pulse. The memory device 100 can thus serve as an analog memory device. Data written to the memory device 100 can later be read from the memory device 100 by measuring the voltage between the storage layers 106-108, wherein the value of the voltage is indicative of a data value associated with the memory device 100. A range and resolution of data values that can be stored by the device 100 is therefore based upon a resolution of the voltage pulse input to the memory device 100 and a resolution of a measuring system used to measure the voltage between the storage layers 106-108.

It is to be understood that, as the term is used herein, "potential-carrier atoms" can include chemical species of the potential-carrier that can have some non-zero charge (i.e., not electrically neutral). The terms "atom" and "ion" are used herein to distinguish between species of the potential-carrier having insufficient electrical charge to pass through the barrier layer 104 (i.e., atoms) and species of the potential-carrier that do have sufficient electrical charge to pass through the barrier layer 104 (i.e., ions). Thus, as the terms are used herein, ions are species of the potential-carrier that have a significantly larger charge magnitude than atoms (e.g., ions may have net charge of +1, −1, +2, −2 . . . in the barrier layer 104 while atoms in the source layer 102 and storage layers 106 and 108 have smaller fractions due to bonding (e.g., +0.8).

Figure 2:
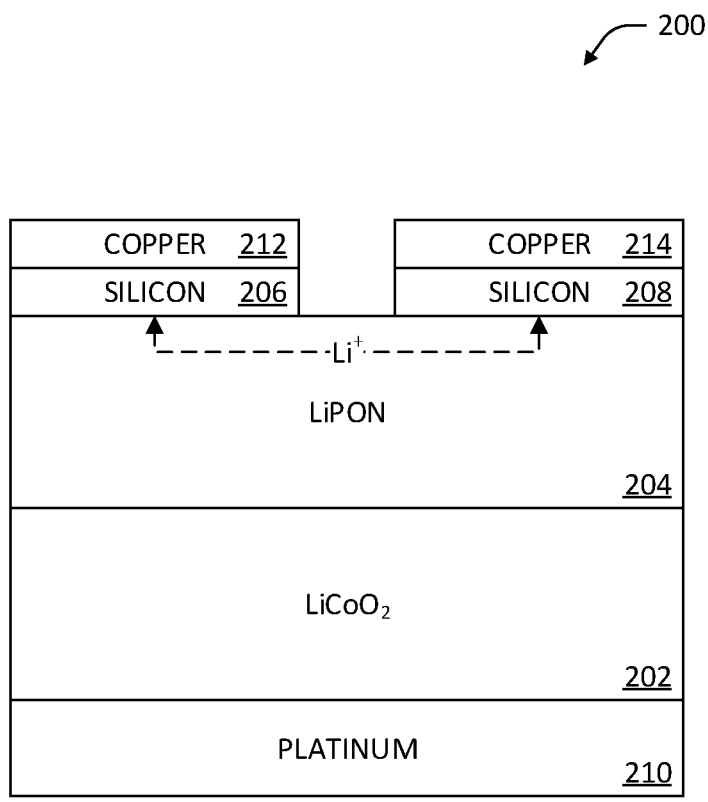
FIG. 2 is an illustration of an exemplary chip-scale implementation of a non-volatile analog memory device.

Referring now to FIG. 2, an exemplary lithium-ion memory device 200 is illustrated. The device 200 includes a lithium cobalt oxide ($LiCoO_2$) layer 202 that serves a source layer for lithium ions, a lithium-phosphor oxy-nitride (LiPON) layer 204 deposited on the $LiCoO_2$ layer 202, the layer 204 serving as a barrier layer, and silicon layers 206 and 208 deposited on the LiPON layer 204, wherein the silicon layers 206-208 function as storage layers. The device 200 further comprises a platinum layer 210 on which the $LiCoO_2$ layer is deposited. Still further, the device 200 comprises copper layers 212 and 214, deposited on the silicon layers 206 and 208, respectively.

In an initialization phase of the memory device 200, lithium is moved from the $LiCoO_2$ source layer 202 into the silicon layers 206 and 208 by applying a biasing voltage between the platinum layer 210 and the copper electrodes 212-214. The platinum layer 210 and the copper electrodes 212-214 provide reliable electrical contact points. Thus, the biasing voltage can reliably be applied between the $LiCoO_2$ source layer 202 and the silicon storage layers 206-208, voltage pulses can reliably be applied between the silicon layers 206 and 208, and voltage measurements can reliably be made between the silicon layers 206 and 208. Application of the biasing voltage causes lithium atoms in the $LiCoO_2$ molecular structure to ionize, migrate to the silicon layers 206-208 and convert back from ions to atoms, whereupon the silicon layers 206-208 can be said to be loaded or impregnated with lithium. The biasing voltage can be applied between the platinum layer 210 and each of the copper layers 212 and 214, whereupon lithium ions move from the $LiCoO_2$ layer 202 to the silicon layer 206 and the silicon layer 208. In the initialization phase, the biasing voltage can be applied between the platinum layer 210 and the copper layers 212-214 until a desired amount of lithium has migrated from the $LiCoO_2$ layer 202 to the silicon layers 206-208. In an exemplary embodiment, the biasing voltage is applied until the silicon layers 206-208 have received 50% of their maximum capacity of stored lithium.

In general, lithium in $LiCoO_2$ is in a lower energy state than lithium in silicon. At an interface between a $LiCoO_2$ layer and a silicon layer, therefore, lithium would tend to migrate from silicon to $LiCoO_2$ absent a biasing voltage causing migration of the lithium to the silicon. The LiPON barrier layer 204 prevents uncharged lithium in the storage layers 206-208 from returning to a lower-energy state in the $LiCoO_2$ layer 202. Lithium atoms in the silicon storage layers 206-208 cannot pass through the LiPON layer 204 to return to a lower-energy state in the $LiCoO_2$ layer 202. Hence, after the biasing voltage is removed the lithium atoms in the silicon storage layers 206-208 remain in the layers 206-208 and act as potential-carriers during operation of the memory device 200. After the initialization phase, the memory device 200 can be used in connection with reading and writing data.

Data is written to the memory device 200 by applying a voltage pulse to the electrodes 212 and 214. The voltage pulse effectively drives lithium from one of the layers 206-208 to the other. Since the amount of lithium present in the silicon layers 206-208 affects a relative electric potential between the layers 206-208, the movement of the lithium in response to application of the voltage pulse causes a voltage buildup between the silicon layers 206-208. An amount of lithium moved between the layers 206-208, and thus an amount of the voltage buildup between the layers 206-208, can be controlled in a predictable fashion by controlling an amplitude and duration of the voltage pulse. The amount of the voltage buildup can further be modified by application of subsequent voltage pulses. For example, a first voltage pulse having a first positive value can cause a voltage buildup of 0.2 V from silicon layer 206 to silicon layer 208. Continuing the example, a second voltage pulse having a second positive value can cause the voltage buildup to increase to 0.3 V from silicon layer 206 to silicon layer 208. Continuing the example further, a third voltage pulse having a negative value can cause the voltage buildup to decrease from 0.3 V to 0.15 V from silicon layer 206 to silicon layer 208.

The memory device 200 can be implemented as a chip-scale device that can be constructed using fabrication techniques similar to those used in the manufacture of integrated circuits (e.g., lithographic fabrication). In an exemplary chip-scale embodiment, the device 200 can be fabricated on a silicon wafer. In the chip-scale embodiment, the platinum layer 210 can have a thickness of approximately 100 nanometers (nm), the $LiCoO_2$ source layer 202 can have a thickness of approximately 300 nm (e.g., 250-350 nm), the LiPON barrier layer 204 can have a thickness of approximately 400 nm (e.g., 350-450 nm), the silicon storage layers 206-208 can have thicknesses of approximately 50 nm (e.g., 30-70 nm), and the copper electrodes 212-214 can have thicknesses of approximately 50 nm (e.g., 30-70 nm). The LiPON layer 204 can be deposited on a first side of the $LiCoO_2$ layer 202, such that the first side of the $LiCoO_2$ layer 202 and a first side of the LiPON layer 204 are in contact. The silicon storage layers 206-208 can be deposited on a same second side of the LiPON layer 204, such that the silicon layers 206-208 are not in physical contact with one another, but so that respective first sides of the silicon layers 206-208 are both in physical contact with the second side of the LiPON layer 204.

Figure 3A:
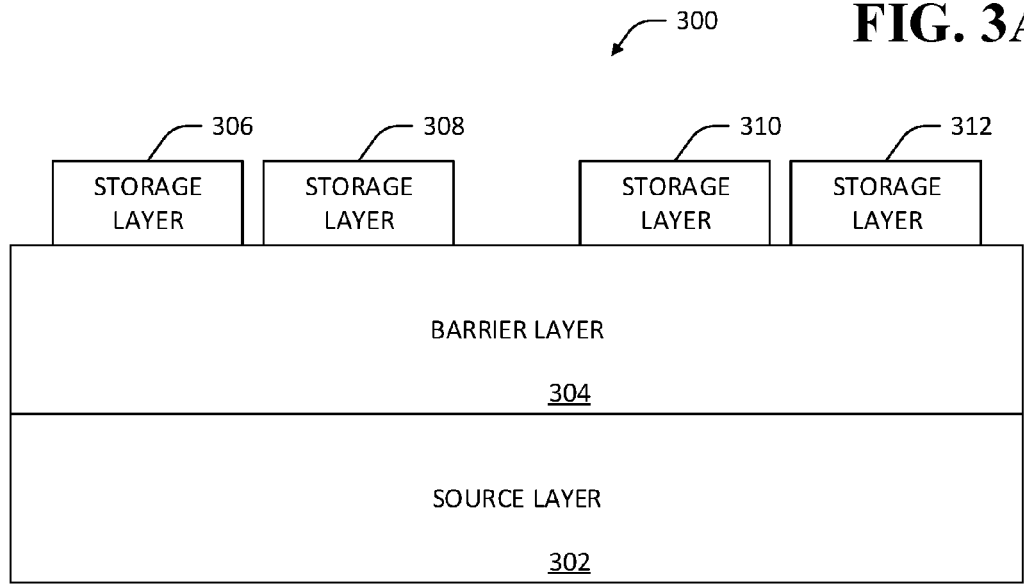
FIG. 3A is a side view of an exemplary memory array.
Figure 3B:
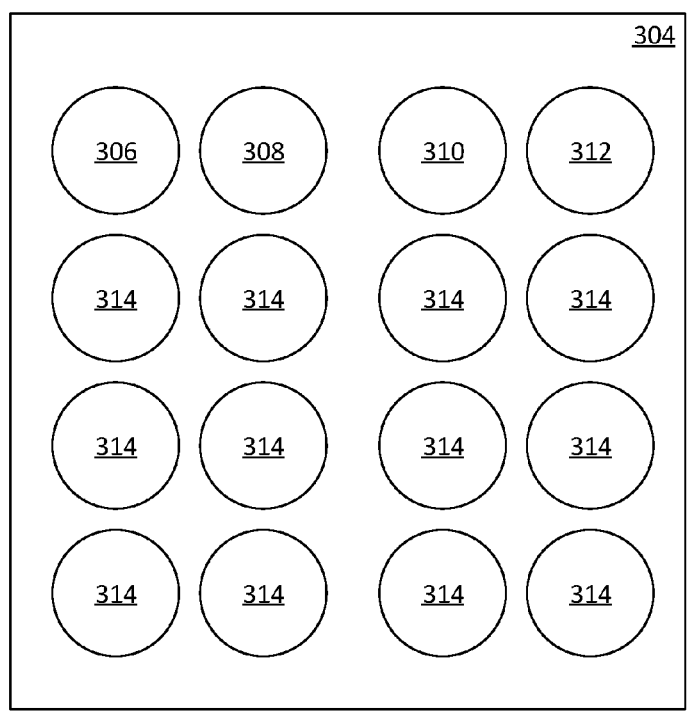
FIG. 3B is a top view of an exemplary memory array.

FIG. 3A illustrates a side view of an exemplary memory array 300. The memory array 300 comprises a source layer 302, a barrier layer 304, and a plurality of storage layers 306-312. The storage layers 306-312 are initialized with potential carriers by application of a biasing voltage between the source layer 302 and the storage layers 306-312. After initialization of the storage layers, data can be written to the array 300 by applying voltage pulses to pairs of storage layers. For example, data can be written to a first memory unit comprising the storage layers 306-308 by application of a voltage pulse between storage layer 306 and storage layer 308, wherein the voltage pulse causes a voltage buildup between the layers 306 and 308 due to migration of potential-carriers (e.g., lithium ions) between the layers 306 and 308. Data can similarly be written to a second memory unit comprising the storage layers 310-312 by application of a voltage pulse between storage layer 310 and storage layer 312. FIG. 3B illustrates a top view of the exemplary memory array 300, wherein a plurality of memory units, each comprising a pair of storage layers, is deposited on the common barrier layer 304. In the memory array 300, all of the storage layers 306-314 in the plurality of memory units can be reset and reinitialized by application of a biasing voltage between the storage layers 306-314 and the source layer 302. In an example, a first biasing voltage can be applied between the storage layers and the source layer 302 that causes potential-carriers in the storage layers to migrate to the source layer 302. A second biasing voltage can then be applied between the storage layers 306-314 and the source layer 302 in order to re-initialize the storage layers 306-314 with potential carriers (e.g., up to a fraction of a maximum capacity of potential carriers for each of the storage layers 306-314).

Figure 4:
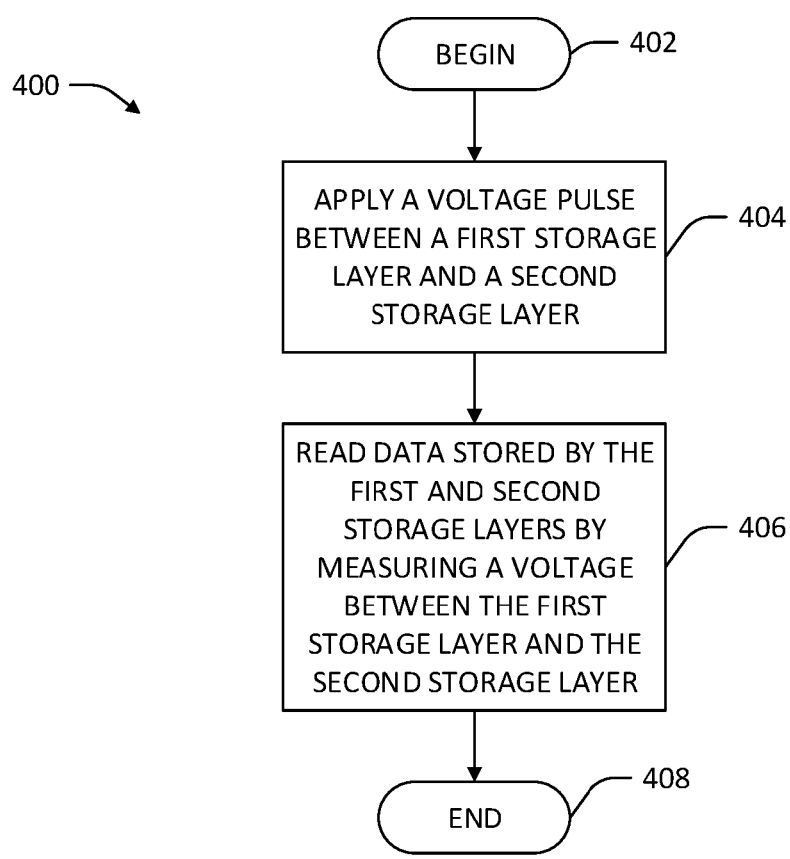
FIG. 4 is a flow diagram that illustrates an exemplary methodology for writing and reading data to a memory device.
Figure 5:
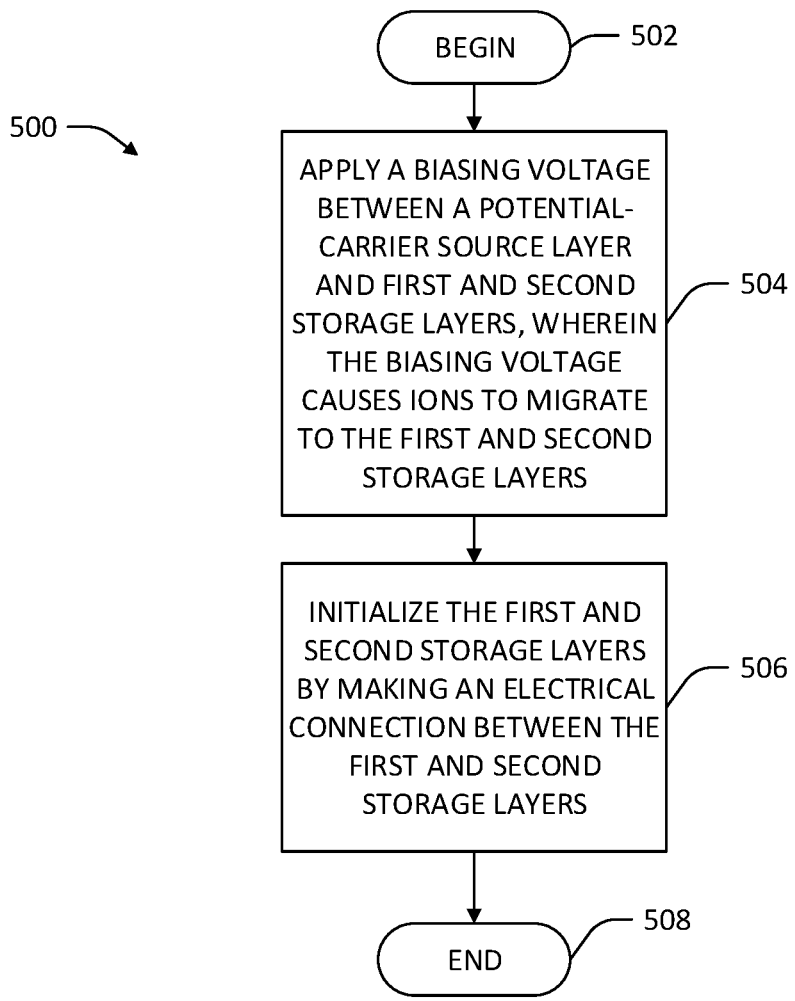
FIG. 5 is a flow diagram that illustrates an exemplary methodology for initializing a memory device.

FIGS. 4-5 illustrate exemplary methodologies relating to non-volatile analog memory units. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein. Moreover, the acts described herein may be performed in whole or in part by a computing device or other electrical system. For example, acts of reading and writing data to analog memory units as set forth herein can be performed by a computing system wherein the analog memory units comprise components of the computing system.

Referring now to FIG. 4, a methodology 400 that facilitates writing data to and reading data from an analog memory unit is illustrated. The methodology 400 begins at 402, and at 404 a voltage pulse is applied between a first storage layer and a second storage layer in order to write data to a memory unit comprising the first and second storage layers. The voltage pulse causes migration of potential-carriers between the first and second storage layers, and a change in the relative concentration of potential-carriers in the first and second storage layers causes a change in voltage between the first and second storage layers. A number of potential-carriers that migrate from one storage layer to the other—and thus a value of data to be written—can be controlled by varying an amplitude and duration of the applied voltage pulse. At 406, data is read from the memory unit by measuring a voltage between the first storage layer and the second storage layer. The measured voltage is indicative of data written to the memory unit at 404, and the value of the measured voltage can be used by a computing system in connection with performing a computing operation. At 408 the methodology 400 ends.

Referring now to FIG. 5, a methodology 500 that facilitates initialization of an analog memory unit is illustrated. The methodology 500 begins at 502, and at 504 a biasing voltage is applied between a potential-carrier source layer and a first potential-carrier storage layer, as well as between the potential-carrier source layer and the second potential-carrier storage layer. The biasing voltage causes potential-carrier ions to migrate to the first and second storage layers from the source layer. At 506, the first and second storage layers are initialized to an equal electric potential (i.e., such that no data value is stored) by making an electrical connection between the first and second storage layers (i.e., an electrical short), whereupon the methodology 500 ends at 508.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. An analog memory system, comprising:
    a barrier layer;
    a first potential-carrier storage layer deposited on the barrier layer;
    a second potential-carrier storage layer deposited on the barrier layer, the second storage layer physically separate from the first storage layer, and wherein responsive to a voltage pulse being applied between the first storage layer and the second storage layer, potential-carrier ions migrate from the first storage layer to the second storage layer by way of the barrier layer; and
    a potential-carrier source layer, the barrier layer deposited on the source layer, wherein responsive to a voltage being applied between the source layer and the respective first and second storage layers, potential-carrier ions migrate from the source layer to the first and second storage layers.

2. The analog memory system of claim 1, wherein the ions are lithium ions.

3. The analog memory system of claim 1, wherein the source layer comprises lithium cobalt oxide ($LiCoO_2$).

4. The analog memory system of claim 3, wherein the $LiCoO_2$ source layer has a thickness of between 250 and 350 nanometers.

5. The analog memory system of claim 3, further comprising a conducting layer, wherein the $LiCoO_2$ source layer is deposited on the conducting layer, and wherein responsive to a voltage being applied between the conducting layer and the respective first and second storage layers, potential-carrier ions migrate from the source layer to the first and second storage layers.

6. The analog memory system of claim 1, wherein the barrier layer comprises lithium-phosphor oxy-nitride (LiPON).

7. The analog memory system of claim 6, wherein the LiPON barrier layer has a thickness of between 350 and 450 nanometers.

8. The analog memory system of claim 1, wherein the first and second storage layers comprise respective first and second silicon layers.

9. The analog memory system of claim 8, the first and second storage layers further comprising respective first and second conducting layers, the first and second conducting layers deposited on the first and second silicon layers, respectively, wherein the ions migrate from the first silicon layer to the second silicon layer responsive to the voltage pulse being applied between the first and second conducting layers.

10. A method for using analog memory, comprising:
    writing data to a memory device, the memory device comprising:
        a barrier layer;
        a first storage layer deposited on the barrier layer; and
        a second storage layer deposited on the barrier layer, the second storage layer physically separate from the first storage layer, and wherein responsive to a voltage pulse being applied between the first storage layer and the second storage layer, potential-carrier ions migrate from the first storage layer to the second storage layer by way of the barrier layer;
        a potential-carrier source layer, the barrier layer deposited on the source layer, wherein responsive to a voltage being applied between the source layer and the respective first and second storage layers, potential-carrier ions migrate from the source layer to the first and second storage layers; and
    reading the data from the memory device.

11. The method of claim 10, wherein writing the data to the memory device comprises applying a voltage pulse between the first storage layer and the second storage layer, wherein the voltage pulse causes ions to move from the first storage layer to the second storage layer.

12. The method of claim 11, wherein the first storage layer and the second storage layer comprise silicon, wherein responsive to applying the voltage pulse between the first storage layer and the second storage layer, lithium ions move from the first storage layers to the second storage layer.

13. The method of claim 10, wherein reading the data from the memory device comprises measuring a voltage between the first storage layer and the second storage layer, the voltage being based upon a number of ions present in the first storage layer relative to a number of ions present in the second storage layer.

14. A memory device, comprising:
    a lithium-phosphor oxy-nitride (LiPON) layer;
    a first memory component comprising:
        a first silicon layer deposited on the LiPON layer; and
        a first conducting layer deposited on the first silicon layer; and
    a second memory component comprising:
        a second silicon layer deposited on the LiPON layer, the second silicon layer physically separate from the first silicon layer; and
        a second conducting layer deposited on the second silicon layer; and
    wherein responsive to a voltage being applied between the first conducting layer and the second conducting layer, lithium ions migrate from the first silicon layer to the second silicon layer by way of the LiPON layer.

15. The memory device of claim 14, wherein the LiPON layer has a thickness of between 350 and 450 nanometers.

16. The memory device of claim 14, the first and second silicon layers having respective thicknesses of between 30 and 70 nanometers.

17. The memory device of claim 14, further comprising a third conducting layer; and
    a lithium cobalt oxide ($LiCoO_2$) layer deposited on the third conducting layer, the LiPON layer deposited on the $LiCoO_2$ layer, wherein responsive to a voltage being applied between the third conducting layer and the first conducting layer, lithium ions migrate from the $LiCoO_2$ layer to the first silicon layer by way of the LiPON layer.

18. The memory device of claim 17, wherein the $LiCoO_2$ layer has a thickness of between 250 and 350 nanometers.

* * * * *